United States Patent [19]
Beckx et al.

[11] Patent Number: 6,096,657
[45] Date of Patent: Aug. 1, 2000

[54] METHOD FOR FORMING A SPACER

[75] Inventors: Stephan Beckx; Stefaan Decoutere; Serge Vanhaelemeersch, all of Leuven, Belgium

[73] Assignee: IMEC VZW, Leuven, Belgium

[21] Appl. No.: 09/281,572

[22] Filed: Mar. 30, 1999

Related U.S. Application Data

[60] Provisional application No. 60/084,445, May 6, 1998.

[30] Foreign Application Priority Data

Mar. 31, 1998 [EP] European Pat. Off. ............. 98870064

[51] Int. Cl.$^7$ ..................................................... H01L 21/00
[52] U.S. Cl. ......................... 438/714; 438/719; 438/734; 438/740
[58] Field of Search ..................................... 438/714, 719, 438/734, 740; 216/67

[56] References Cited

U.S. PATENT DOCUMENTS

| | | |
|---|---|---|
| 5,094,712 | 3/1992 | Becker et al. . |
| 5,112,435 | 5/1992 | Wang et al. . |
| 5,235,206 | 8/1993 | Desilets et al. . |
| 5,753,561 | 5/1998 | Lee et al. ............................. 438/740 X |
| 5,843,835 | 12/1998 | Liu ...................................... 438/719 X |
| 5,935,875 | 8/1999 | Lee ...................................... 438/740 X |

FOREIGN PATENT DOCUMENTS

| | | |
|---|---|---|
| 0 272 143 A2 | 6/1988 | European Pat. Off. . |
| 0 395 358 A2 | 10/1990 | European Pat. Off. . |
| 0 490 111 A1 | 6/1992 | European Pat. Off. . |
| 0 766 295 A1 | 4/1997 | European Pat. Off. . |

OTHER PUBLICATIONS

Steven Ward et al., "A Highly Sensitive Anisotropic Nitride Etch Process Using SF6/HBR Chemistries", 1046b Extended Abstracts, vol. 93/1, Jan. 1, 1993, pp. 1261–1262.

K. Ehinger et al., "Narrow BF$_2$ Implanted Bases For 35 GHz/24 ps High–Speed Si Bipolar Technology", Proceedings of the International Electron Devices Meeting, Washington, Dec. 8–11, 1991, Dec. 8, 1991, pp. 91/459–462, Institute of Electrical and Elctronics Engineers, pp. 16.5.1–16.5.4.

*Primary Examiner*—William Powell
*Attorney, Agent, or Firm*—Knobbe, Martens, Olson & Bear, LLP

[57] ABSTRACT

A method is disclosed for forming a spacer, wherein said formation is preferably performed in a single dry etch sequence in a single dry etch tool. In this single dry etch sequence subsequently polysilicon spacers are defined, used as an etch mask and removed. Said etch sequence comprises at least one dry etching step. In case said etch sequence comprises more than one dry etching step, then these etching steps are performed subsequently in the same etch tool without breaking vacuum in said etch tool. In an embodiment of the invention the capability of using a single dry etch sequence for the formation of nitride spacers, using polysilicon spacer masking and the in-situ removal of the remaining polysilicon spacers, is demonstrated.

10 Claims, 3 Drawing Sheets

| Step<br>Parameter | Step c.1) | Step c.2) | Step d.1) | Step d.2) | Step e) |
|---|---|---|---|---|---|
| Pressure ( mTorr ) | 7 | 12 | 7 | 7 | 40 |
| RF_Upper ( W ) | 300 | 300 | 300 | 300 | 250 |
| RF_Lower ( W ) | 110 | 80 | 110 | 110 | 150 |
| Cl2 ( sccm ) | 60 | 50 | 60 | 60 | 0 |
| 20%O2/He ( sccm ) | 0 | 5 | 0 | 0 | 10 |
| He ( sccm ) | 0 | 0 | 0 | 0 | 100 |
| HBr ( sccm ) | 80 | 150 | 80 | 80 | 50 |
| He Backside Pressure ( Torr ) | 7 | 7 | 7 | 7 | 7 |
| Completion | Time | Slp>= | Slp>= | Time | Time |
| Time ( sec ) | 30 | - | - | 5 | 300 |
| Delay ( sec ) | 0 | 10 | 8 | 0 | 0 |
| Norm ( sec ) | 0 | 1 | 3 | 0 | 0 |
| Trigger ( % ) | 0 | 99 | 80 | 0 | 0 |
| Norm_Value | 0 | 10000 | 10000 | 0 | 0 |
| Slope_CS | 0 | 100 | 0 | 0 | 0 |
| Slope_TM | 0 | 2 | 0 | 2 | 0 |
| Poly Etch Rate ( nm/min ) | 250 | 200 | 250 | 250 | 150 |
| Oxide Etch Rate ( nm/min ) | 20 | 10 | 20 | 20 | < 1 |
| Nitride Etch Rate ( nm/min ) | 40 | 25 | 40 | 40 | < 1 |

- Slp>= : Triggering on Slope (increasing slope )

METHOD FOR FORMING A SPACER

This application claims the benefit of U.S. Provisional Application No. 60/084,445, filed May 6, 1998.

FIELD OF THE INVENTION

The present invention is related to the formation of a spacer, particularly an insulating spacer, by a sequence of at least one dry etching step. Spacers are structures being frequently used in the process of manufacturing integrated circuits. These insulating spacers can be used to isolate two conductive layers one from another in such a process. Particularly, in case this process is a bipolar or a BICMOS process, these spacers can assist in the formation of the base-emitter structure.

BACKGROUND OF THE INVENTION

Insulating spacers are widely used in the process of manufacturing integrated circuits. These spacers are mainly used for two important applications namely to isolate two conductive patterns on from another and as masking elements. Especially if their sole function is their use as masking elements, sacrificial spacers are often used, i.e. they are removed later on in the process. However, for quite a number of applications structural spacers are used because both their function as insulating elements as well as masking element is required. Examples of such structural spacers can be found, e.g. in a MOSFET, particularly in a MOSFET with a lightly doped drain (LDD) and/or source, where the spacers are located at the sidewalls of the polysilicon gate and are used to isolate the gate from the drain/source as well as to serve as a masking elements for the implantation of the lightly doped drain/source regions. Another example of such structural spacers can be found, e.g. in a bipolar device, particularly in the emitter-base region as e.g. in FIG. 1 of the U.S. Pat. No. 5,439,833, where the spacers are used to define the emitter opening as well as to isolate the conductive layer connecting the emitter from the base connection (the base polysilicon).

Especially in the two aforementioned examples, the formation of the (structural) spacers is a very critical part of the manufacturing process because this spacer formation has a large influence on the definition of the intrinsic device and therefore on the device characteristics. Because the dimensions of the intrinsic device are very small, i.e. typically in the deep sub-micron range, one has to be able to define these spacers in a very controllable and reproducible way in order to be able to meet the stringent yield and reliability specifications. This problem will even be more stringent in the future due to the ongoing downscaling of the device dimensions.

In view of this problem a spacer formation process should comprise a minimum of process steps in order to reduce yield problems, should be simple to reduce process complexity and increase yield and reproducibility. Furthermore wafer handling, exposure to a possible contaminating ambient and exposure to an oxidizing ambient has to be avoided as much as possible because this might necessitate the introduction of extra process steps, particularly cleaning steps and extra etching steps, and therefore has a negative influence on yield, reliability and cost.

SUMMARY OF THE INVENTION

In an aspect of the invention, a method is disclosed for forming a spacer on a substrate comprising at least a first region and a second region, said first region being uncovered, said second region comprising at least one layer, said method comprising the steps of:

a) forming a first and a second insulating layer on said first and said second region;

b) forming a polysilicon layer on said first and said second insulating layer;

c) anisotropically dry etching said polysilicon layer using said second insulating layer as an etch stop layer to thereby form at least one polysilicon spacer on said first region adjacent to said second region;

d) anisotropically dry etching said second insulating layer, using said polysilicon spacer as a mask and said first insulating layer as an etch stop layer; and e) removing said polysilicon spacer in at least one dry etching step to thereby free the insulating spacer formed in said second insulating layer. Instead of using polysilicon as sacrificial spacer material also amorphous silicon can be used. In fact any material can be used which can be at least etched anisotropically and selectively towards the second insulating material, e.g. silicon nitride. Preferably said insulating spacer is L-shaped.

In an embodiment of the invention a method is disclosed wherein prior to the dry etching of the polysilicon layer, i.e. step c), first a native oxide, formed during exposure of said substrate to an ambient comprising oxygen, is removed.

In another embodiment of the invention, a method for forming a spacer on a substrate is disclosed, wherein said substrate is placed in a chamber of an etch tool, said chamber having an ambient comprising HBr or a mixture of HBr and $Cl_2$. Particularly in case step c) is performed, said ambient can further comprise a small amount of oxygen, i.e. typically less than 5%. Instead of a HBr-based chemistry also a fluorine based chemistry can be applied like e.g. $CF_4$, or $C_2F_6$, or any other dry etch chemistry suited to remove polysilicon selectively, i.e. typically with a ratio of about 3:1 or higher, from said second insulating layer can be applied. In case step d) is performed, said ambient can further comprise a small amount of oxygen, i.e. typically less than 5%. Instead of a HBr-based chemistry also any other dry etch chemistry suited to remove said second insulating layer selectively, i.e. typically with a ratio of about 2:1 or higher, to said polysilicon spacer can be applied. In case step e) is performed, i.e. the polysilicon spacer removal step, said ambient can further comprise He or a mixture of He and oxygen, or instead of a HBr-based chemistry also any other dry etch chemistry suited to remove the remaining of said polysilicon spacer and eventually other residues selectively to said first and said second insulating layer. During steps c), d) and e) the substrate is located in a chamber of an etch tool, said chamber having a controllable ambient and being pressurized at a value substantially below the atmospheric pressure, i.e. typically in the range between 1 and 100 mTorr. Steps c), d) and e) can be performed without breaking vacuum, i.e. without exposing said substrate to the air and more particularly without switching the pressure between said value substantially below the atmospheric pressure and a value of about the atmospheric pressure, by adapting and/or adjusting the flow of the chemicals. This can be done in a single chamber of an etch tool, or at least in a chamber of a single etch tool. Preferably this chamber is equipped with separate inlets for supplying each of said chemicals and controllable elements, e.g. valves, to control the flow through these inlets.

In another embodiment of the invention, said substrate comprising said first and said second region is placed in a chamber of an etch tool after said first and said second insulating layer and said polysilicon layer are formed on said first and said second region of said substrate. Thereafter, said substrate in said chamber can be subjected to a single removal process comprising dry etching steps c), d) and e) without breaking vacuum in said chamber. Particularly, for the formation of the spacer, preferably said spacer is a L-shaped spacer of an insulating material, a removal process is developed wherein in one removal sequence the remaining polysilicon spacer is removed as well as said L-shaped spacer of an insulating material is formed. By doing so, the introduction of an extra removal step, after breaking vacuum, to remove the polysilicon spacer is avoided.

According to this embodiment of the invention, dependent on the precise etch chemistry, steps c) and d) or steps d) and e) or steps c), d) and e) can be combined. In the latter case, the single removal process comprises only one anisotropic dry etching step.

In another embodiment of the invention, a method is disclosed for forming a spacer on a substrate wherein said first and said second insulating layer are selected from a group comprising oxides, nitrides and oxynitrides. Particularly, when said spacer is a nitride spacer, preferably said first insulating layer is an oxide layer and said second insulating layer is a nitride layer.

In still another embodiment of the invention said at least one layer of said second region can be a polysilicon layer or an oxide layer or a combination of a polysilicon layer and an oxide layer.

DETAILED DESCRIPTION OF THE INVENTION

Figure 1:
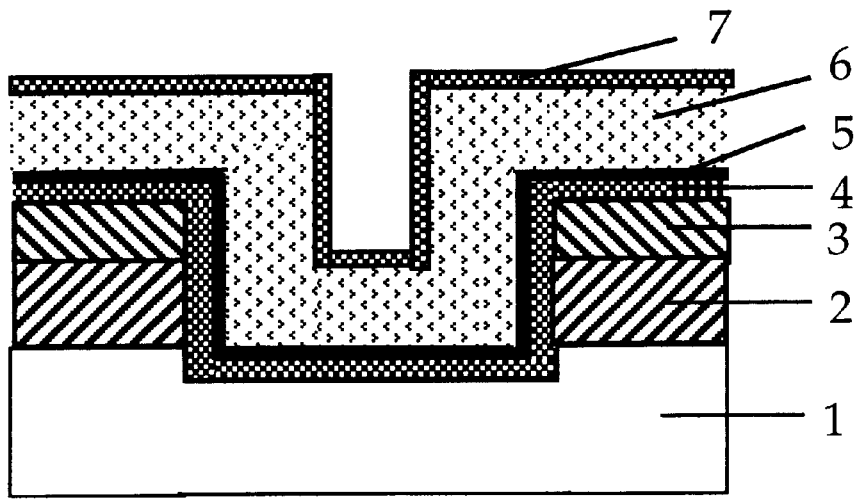
FIG. 1 depicts, according to an embodiment of the invention, a part of a substrate (1) comprising at least a first region and a second region, said first region being uncovered, said second region comprising a polysilicon layer (2) and an oxide layer (3). On these region the following stack of layers is formed: an oxide layer (4), a nitride layer (5), a polysilicon layer (6) and an oxide layer (7).

In relation to the appended drawings the present invention is described in detail in the sequel. It is apparent however that a person skilled in the art can imagine several other equivalent embodiments or other ways of executing the present invention, the spirit and scope of the present invention being limited only by the terms of the appended claims.

In a preferred embodiment of the invention, as an example, a method is disclosed (see also FIG. 1) for forming a spacer on a substrate (1) comprising at least a first region and a second region, said first region being uncovered, said second region comprising a polysilicon layer (2) and an oxide layer (3). In the example the thickness of the polysilicon layer is 250 nm, while the thickness of the oxide layer is 200 nm. The invention is not limited however to the precise materials, thickness, conditions, etch recipes and etch tool, used in this example, but extends to all equivalents imaginable to a person skilled in the art. Said method comprises the step of:

a) forming a first and a second insulating layer on said first and said second region of said substrate, said first insulating layer being an oxide layer (4), said second insulating layer being a nitride layer (5). Particularly, in the example, the oxide layer has a thickness of 50 nm, while the nitride layer has a thickness of 20 nm. The substrate is a silicon wafer, in particular a 150 mm wafer. Alternatively, said substrate can be a partly processed or a pristine wafer or slice of a semiconductive material, like Si or Ga As or Ge or SiGe, or an insulating material, e.g. a glass slice. Particularly, in case said substrate is a partly processed wafer or slice; at least a part of the active and/or passive devices can already be formed. In general, said first and second insulating layer can be selected from the group of oxides, nitrides and oxynitrides, provided that polysilicon can be etched selectively to said second insulating layer and that said second insulating layer can be etched selectively to polysilicon and said first insulating layer.

Figure 2:
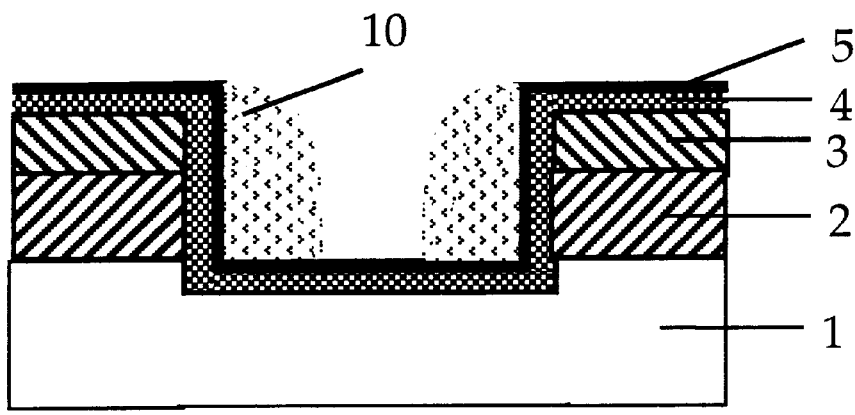
FIG. 2 depicts the structure as illustrated in FIG. 1 after two etching steps are performed according to an embodiment of the invention.

According to this embodiment of the invention, the method further comprises the step of:

b) forming a second sacrificial polysilicon layer (6) on said first and said second insulating layer. Prior to the introduction of the substrate in a chamber of an etch tool wherein the removal process is performed, by handling the substrate in an ambient comprising oxygen a native oxide (7) can be formed on said second polysilicon layer. Possibly also a patterned resist layer can be formed on said second polysilicon layer, with or without said native oxide, to serve as an etch mask during the polysilicon etch process. Then according to this example, the substrate, as depicted in FIG. 1, i.e. with a native oxide layer on top and without a patterned resist layer, is introduced in the etch tool, i.e. the TCP9400SE Plasma Etch system from Lam Research. This system has the following characteristics:

Low Pressure-High Density
RF-Powered Top TCP Coil for Plasma Generation
RF-Powered Bottom Electrode
100% Anisotropic Etch
Electrostatic Chuck According to this embodiment of the invention, the method further comprises the steps (FIG. 2) of:

c.1) removing said native oxide;

c.2) anisotropically etching said polysilicon layer to thereby form at least one polysilicon spacer (10) on said first region adjacent to said second region. This anisotropy is important because it determines, dependent on the thickness of the polysilicon layer and the step height of the second region, the width and the shape of the polysilicon layer. However, as further clarified in step d) the method of the present invention is less critical for the precise shape of the sacrificial spacer formed. Particularly, in the example (see FIGS. 2 and 4), this removal step c.1) is performed by a dry etching step in said chamber of said etch tool in an ambient comprising HBr and $Cl_2$ at a low pressure of 7 mTorr. Then, without breaking vacuum the next removal step c.2) is performed, i.e. a dry etching step in an ambient, comprising HBr, $Cl_2$ and a mixture of oxygen and helium, at a low pressure of 12 mTorr, and the polysilicon spacers are defined. To define the polysilicon spacers, besides the HBr based etch recipe as used in the example, also other etch recipes can be used, provided that a number of conditions are met, like:

At first, in order to perform the polysilicon spacer definition accurately and reproducibly, the etch step, i.e. step c.2), that defines the spacer can be halted automatically. This is achieved by the end point triggering algorithm. Alternatively, this etch step c.2) can also be a timed etch step. End point triggering is based on the detection of an emission signal, i.e. the spectral variation that occurs when going from one layer to another. However, accurate end point triggering is only possible if an adequate stopping-layer is present. Examples of such stopping layers are oxides, nitrides and oxynitrides. To prevent etch-through of this stopping layer during the etch step a minimal thickness, typically a thickness of about 5 nm, is required.

At second, an automatic end point triggering is only useful if the etch rate of the etch step, i.e. step c.2), in this stopping layer is sufficiently low. In other words, the etch rate ratio of the polysilicon layer to the stopping layer has to be sufficiently high, i.e. typically higher than 3:1. In the example the stopping layer is a nitride layer. The etch rate ratio of polysilicon to nitride is 7:1.

Figure 3:
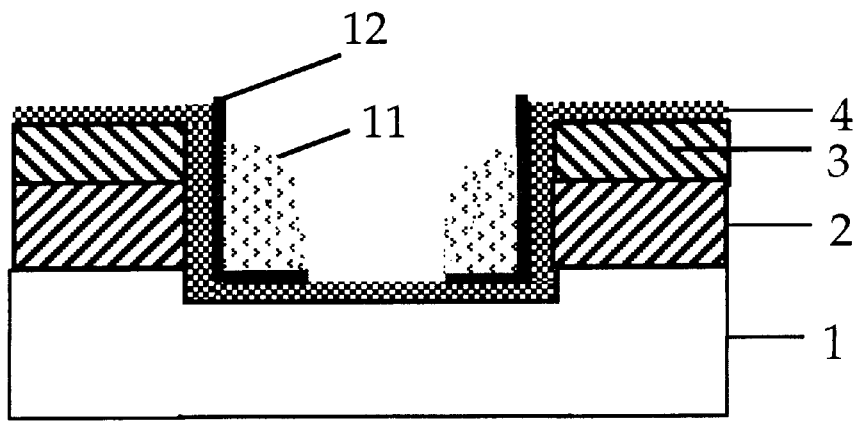
FIG. 3 depicts the structure as illustrated in FIG. 2 after an etching step is performed to form nitride spacers according to an embodiment of the invention.

Further according to this embodiment of the invention, the method further comprises the step (FIG. 3) of:

d.) anisotropically dry etching said second insulating layer, using said polysilicon spacer as a mask and said first insulating layer as an etch stop layer. Particularly, the polysilicon spacers defined in the previous etch step (step c.2)) can be used as an etch mask in this subsequent etch step.(step d)). Because this etch step is highly anisotropic a good control of the dimensions and shape of the L-spacer formed can be obtained. Anisotropy is a prerequisite here which even allows for somewhat less stringent requirements with respect to the anisotropy of the polysilicon etch process (step c)) as step d) is decisive anyhow for the dimensions and shape of the L-spacer. According to the example the second insulating layer is a nitride layer with a thickness of 20 nm. Step d), i.e. the nitride removal step, is performed after step c.2)) without breaking vacuum. The complete sequence for the removal of the nitride layer (FIGS. 3 and 4.) uses an end point triggered step, i.e. step d.1), followed, again without breaking vacuum, by a five-second over-etch step, i.e. step d.2). Both dry etching steps d.1) and d.2) are performed in an ambient comprising HBr and $Cl_2$, at a low pressure of 7 mTorr.

The polysilicon spacers, being defined in step c), can be used as masking material for the subsequent nitride etch, or in general the second insulating layer etch, provided that a number of conditions are met like e.g.:

At first, a good highly anisotropic dry etching chemistry for the removal of the second insulating layer has to be available. Particularly, when this second insulating layer is a nitride layer, several dry etch chemistries can be used like e.g. a carbon-fluorine based chemistry. According to this example, a HBr—$Cl_2$ based chemistry is used. In any case the dry etch chemistry has to be such that the etch rate ratio of said second insulating layer, i.e. nitride, to polysilicon is sufficiently high.

At second, in order to perform the etching of the second insulating layer, i.e. the nitride layer, accurately and reproducibly, the etch step, i.e. step d.1), can be halted automatically. This is achieved by the end point triggering algorithm. Alternatively, this etch step can be a timed etch step. However, accurate end point triggering is only possible if an adequate stopping-layer, i.e. the first insulating layer, is present. According to the example said stopping layer is an oxide layer (4) with a thickness of 50 nm. To prevent etch-through of this stopping layer during the etch step a minimal thickness, e.g. about 5 nm, is required. Furthermore, an automatic end point triggering is only useful if the etch rate of the etch step, i.e. step d.1), in this stopping layer, i.e. the oxide layer, is sufficiently low. In other words, the etch rate ratio of the nitride layer to the oxide layer has to be sufficiently high, but this strongly depends on the thickness of the oxide layer. Because a nitride layer with a thickness of 20 nm and an oxide layer with a thickness of 50 nm is used, the value of the etch rate ratio of the nitride layer to the oxide layer is less critical. In the example, this etch rate ratio is 2:1.

Figures 4, 5:
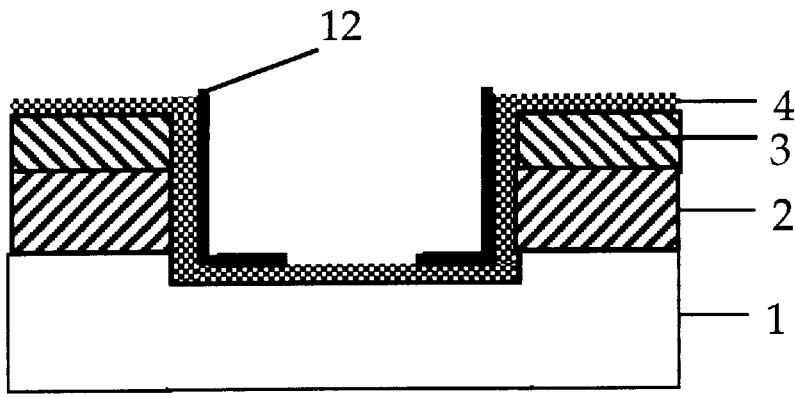
FIG. 4 depicts the structure as illustrated in FIG. 3 after an etching step is performed, i.e. the polysilicon residues are removed, according to an embodiment of the invention.
FIG. 5 depicts a table comprising a detailed description of the different etch steps used in a dry etch sequence, according to an embodiment of the invention, to form nitride spacers using polysilicon spacers as a mask and with in-situ removal of these polysilicon spacers.

Further according to this embodiment of the invention, the method further comprises the step of:

e) removing said polysilicon spacer (see FIG. 4) to thereby free the spacer formed in said nitride layer. Preferably said nitride spacer is L-shaped. Steps c), d) and e) are performed subsequently in a chamber of an etch tool without breaking vacuum. The removal of the remaining of the second polysilicon layer is a dry etching step performed in an ambient, comprising HBr, He and a mixture of He and oxygen, at a low pressure of 40 mTorr. The choice of the dry etch chemistry has to be based on a number of conditions like e.g.:

At first, the etch selectivity of polysilicon to oxide and nitride is important because the aim of this etch step, i.e. step e) is to remove the polysilicon residues, without attack the oxide and nitride layers. Therefore an etch step is to be used which has a high selectivity towards the mentioned layers. This is demonstrated in the example (see also FIG. 5) in an ambient, comprising HBr, He and a mixture of He and oxygen. As can be seen in FIG. 5, long etch times are required but no attack of the nitride and the oxide is observed.

At second, it is evident that no polysilicon residues may be left after the complete removal process. Therefore a long etch time is applied. Calculations reveal that a minimal time to remove the polysilicon spacer is 150 seconds. When applying a 100% over-etch time, the total etch time adds up to 300 seconds. Using this long total etch time no more polysilicon residues are observed.

According to an embodiment of the invention, a method is disclosed for forming an insulating spacer in a single etch sequence in a single etch tool wherein subsequently polysilicon spacers are defined, used as an etch mask and removed. Said etch sequence comprises at least one dry etching step. In case said etch sequence comprises more than one dry etching step, then these etching steps are performed subsequently in the same etch tool without breaking vacuum in said etch tool. Some benefits of this method are clearly reduction in process time, in substrate handling and process cost and complexity.

Figure 6:
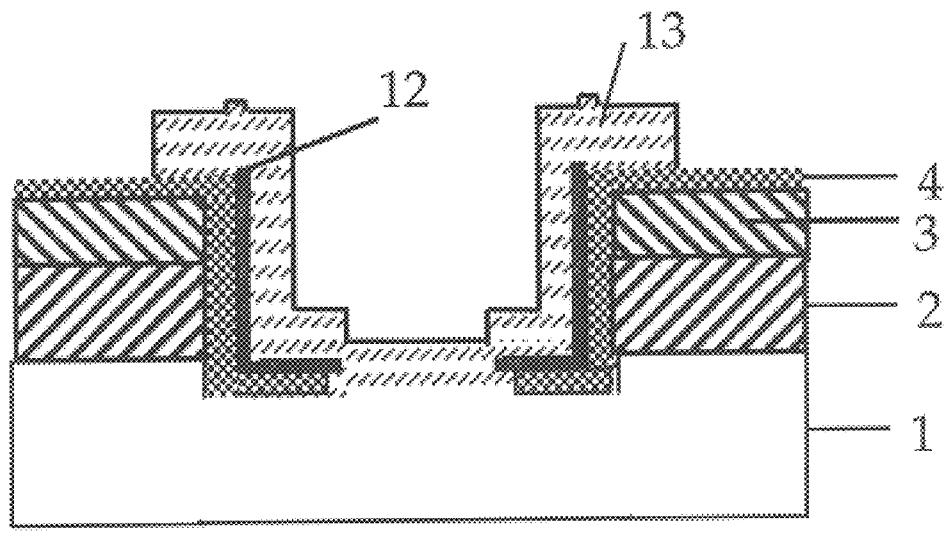
FIG. 6 depicts the structure as illustrated in FIG. 3 after the emitter opening is formed and the emitter polysilicon layer is deposited and patterned, according to an embodiment of the invention.
Figure 7:
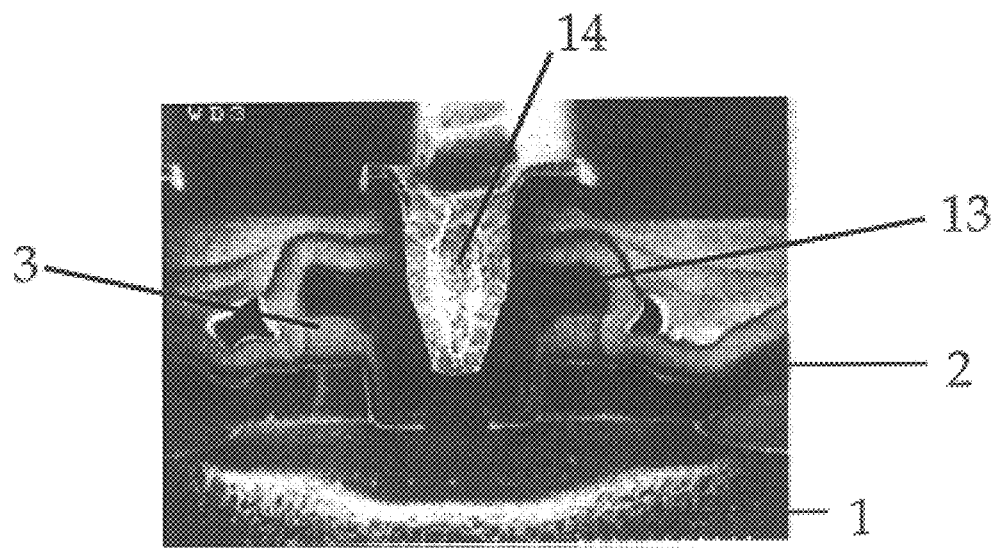
FIG. 7 depicts a SEM cross section of a 0.35 •m bipolar transistor processed up to the first metal level (14) according to an embodiment of the invention

In another embodiment of the invention, a method is disclosed for forming a nitride spacer on a substrate comprising at least a first region and a second region, said first region being uncovered, said second region comprising a first polysilicon layer and a first oxide layer, said method comprising the steps of:

a) forming a second oxide layer and a nitride layer on said first and said second region of said substrate;

b) forming a second sacrificial polysilicon layer on said oxide and said nitride layer;

c) anisotropically etching said second polysilicon layer to thereby form at least one polysilicon spacer on said first region adjacent to said second region;

d) removing said nitride layer, using said polysilicon spacer as a mask; and e) removing said polysilicon spacer to thereby free the spacer formed in said nitride layer. Preferably said nitride spacer is L-shaped. Steps c), d) and e) are performed in a chamber of an etch tool without breaking vacuum. This method can be a part of the formation of an emitter-base structure of a bipolar transistor (see FIGS. 6 and 7). In this case the first region defines the intrinsic base region The part of the first polysilicon layer contacting the substrate, defines and contacts the extrinsic base region. The emitter can be formed in said intrinsic base region by out-diffusion of a deposited doped third polysilicon (13) layer in the substrate. Before this can be done, first the second oxide layer is removed using the nitride spacers as a mask, e.g. by a wet etching step. Then a third polysilicon layer can be deposited. The out-diffusion from this third polysilicon layer in the substrate is limited to the exposable substrate areas, i.e. the openings between two opposite L-shaped nitride spacers, where said nitride spacers isolate said third polysilicon layer from said first polysilicon layer. For reproducibility reasons, the control over the dimensions of these openings is crucial, particularly for sub 0.5 µm emitter widths. This control is directly determined by the control over the dimensions of the L-shaped spacers and consequently determined by the anisotropy of the spacer formation process.

What is claimed is:

1. A method for forming a spacer on a substrate comprising at least a first region and a second region, said first region being uncovered, said second region comprising at least one layer, said method comprising the steps of:

a) forming a first and a second insulating layer on said first and said second region;

b) forming a polysilicon layer on said first and said second insulating layer;

c) anisotropically dry etching said polysilicon layer using said second insulating layer as an etch stop layer to thereby form at least one polysilicon spacer on said first region adjacent to said second region;

d) anisotropically dry etching said second insulating layer, using said polysilicon spacer as a mask and said first insulating layer as an etch stop layer; and e) removing said polysilicon spacer in at least one dry etching step.

2. A method as in claim 1, wherein said substrate is placed in a chamber of an etch tool, said chamber comprising a plasma ambient and being pressurized at a value substantially below atmospheric pressure, said substrate being subsequently subjected to the steps c), d) and e) by changing, without breaking vacuum, at least the composition of said plasma ambient at least at the onset of each of the steps c), d) and e).

3. A method as in claim 2, wherein said first insulating layer is a silicon nitride and said second insulating layer is a silicon oxide.

4. A method as in claim 3, wherein said plasma ambient in said chamber is composed of at least HBr being supplied through a controllable inlet in said chamber, said chamber further containing controllable separate inlets allowing the supply of chlorine, oxygen and He to thereby adjust said composition of said plasma by adjusting the flows of HBr, chlorine, oxygen and He through said inlets.

5. A method as recited in claim 4, wherein each of said flows is adjustable from 0% to 100%.

6. A method as in claim 1, wherein said anisotropically etching of said polysilicon is performed in an ambient comprising HBr, or fluorine, or a mixture of HBr and $Cl_2$.

7. A method as in claim 4, wherein said plasma ambient further comprises oxygen.

8. A method as in claim 1, wherein said first and said second insulating layer are selected from a group comprising nitrides, oxides and oxynitrides.

9. A method as in claim 1, wherein said layer of said second region is a polysilicon layer or an oxide layer or a combination of a polysilicon layer and an oxide layer.

10. A method for forming a spacer on a substrate comprising at least a first region and a second region, said first region being uncovered, said second region comprising at least one layer, said method comprising the steps of:

a) forming a first and a second insulating layer on said first and said second region;

b) forming a polysilicon layer on said first and said second insulating layer;

c) placing said substrate in a chamber of an etch tool, said chamber comprising a HBr-containing plasma ambient, being pressurized at a value substantially below atmospheric pressure and having separate inlets for controllably supplying gaseous substances to said chamber to thereby adjust the composition of said plasma ambient; and d) subsequently, without braking vacuum, subjecting said substrate in said chamber to the following steps while controlling the flows of said gaseous substances:

d.1) anisotropically dry etching said polysilicon layer using said second insulating layer as an etch stop layer to thereby form at least one polysilicon spacer on said first region adjacent to said second region;

d.2) anisotropically dry etching said second insulating layer, using said polysilicon spacer as a mask and said first insulating layer as an etch stop layer; and d.3) removing said polysilicon spacer in at least one dry etching step.

* * * * *